United States Patent [19]

Terakawa et al.

[11] Patent Number: 5,008,486
[45] Date of Patent: Apr. 16, 1991

[54] ELECTROMAGNETIC WAVE SHIELDING PANELS AND WALL STRUCTURE

[75] Inventors: Takashige Terakawa; Wataru Kusakabe, both of Yokohama, Japan

[73] Assignee: Tokyo Keiki Co., Ltd., Tokyo, Japan

[21] Appl. No.: 454,482

[22] Filed: Dec. 21, 1989

[30] Foreign Application Priority Data

Dec. 21, 1988 [JP] Japan ................. 63-322758

[51] Int. Cl.$^5$ ............................. H05K 9/00
[52] U.S. Cl. .................. 174/35 MS; 174/35 R
[58] Field of Search .......... 174/35 R, 35 MS; 361/424; 219/10.55 D, 10.55 R

[56] References Cited

U.S. PATENT DOCUMENTS 2,860,176 11/1958 Lindgren .............. 174/35 MS
3,153,692 10/1964 Lindgren .............. 174/35 MS

FOREIGN PATENT DOCUMENTS

2426890 12/1974 Fed. Rep. of Germany .

*Primary Examiner*—Leo P. Picard
*Assistant Examiner*—Bot L. Ledynh
*Attorney, Agent, or Firm*—Lowe, Price, LeBlanc, Becker & Shur

[57] ABSTRACT

An improved electromagnetic wave shielding panel and wall structure includes a plate member of electrically nonconductive material and an electrically conductive foil applied to at least one surface thereof, with an electrically conductive net laid on the electrically conductive foil with its fringe portion extending beyond the edge of the plate member. The use of an electrically conductive net which extends beyond the edge of the plate member, facilitates electrical connection at the joint between adjacent panels and enhances electromagnetic shielding at both low and high impedance levels. Necessary electrical connections can be made simply by abutting the adjacent side surfaces of the panels against each other with their net fringe portions sandwiched therebetween.

14 Claims, 11 Drawing Sheets

FIG. 12A (A-I, NET ONLY)

FIG. 12B

(A-I, NET+COPPER FOIL)

FIG.12C

FIG.13A
(A-I, NET ONLY)

FIG.13B
(A-I, NET+COPPER FOIL)

FIG.13C

FIG.14A (B-I, NET ONLY)

FIG.14B

(B-I, NET+COPPER FOIL+JOINT ATTACHMENT)

FIG.15A
(B-II, NET ONLY)

FIG.15B
(B-II, NET+COPPER FOIL+JOINT ATTACHMENT)

FIG. 16

(B-1, DOUBLE NET+COPPER FOIL+JOINT ATTACHMENT)

ELECTROMAGNETIC WAVE SHIELDING PANELS AND WALL STRUCTURE

BACKGROUND OF THE INVENTION

1. Field of the Invention

The present invention relates to electromagnetic wave shielding panels and wall structure which are suitable for use in forming an electromagnetic wave shielding room.

2. Background of the Prior Art

Heretofore, there have been three different electromagnetic wave shielding structures which provide a space which is substantially free from electromagnetic waves. The first type of shield structure was used in the early days, and it uses shield walls of metal net. The second type of shield structure uses shield walls of zinc-plated iron sheets. Finally, the third type of shield structure uses plywood sheets with copper foil applied on the inside surfaces thereof to form an enclosed space thereby.

The first metal net shield is relatively less expensive, but the shielding effect is not satisfactory because a low metal net structure cannot reduce the effect of a impedance field in which the magnetic field is predominant.

The second type of shield structure using corrosion-resistant, zinc-plated iron sheets can reduce the effect of the magnetic field, and its shielding effect is excellent. Therefore, this type of shield has been widely used. The defect of this type of shield, however, is the need to use screws in making necessary electrical connections at joints between adjacent shield panels to form a shield wall. The zinc plating is soft enough to facilitate electrical connection by screwing. The iron sheet, however, is so hard that it must be screwed at relatively narrow intervals. This disadvantageously requires time consuming assembling work, accordingly increasing the assembling cost. Still disadvantageously, when it is used in a strong magnetic field such as in magnetic resonance imaging, a strong magnetic force will be applied to the panels using iron sheets, and therefore, extra structure rigidity is required. It cannot be used for a system using permanent magnets because of its demagnetization effect.

As for the third type of shielding room, pieces of copper foil are applied and soldered to the joints between adjacent panels. Wood and other ordinary architectural materials are used to form such shielding rooms, and therefore building costs are low, compared with the second type of shielding structure. This third type of shielding room has a continuous copper foil surface on the surrounding wall, and therefore a decreased impedance field in which the magnetic field is predominant, will induce eddy currents, in the electrically conductive wall to cancel the effect of the arriving magnetic field. Thus, a substantial magnetic shielding effect will be attained although not as much as the second type of shielding structure. This third type of shielding structure, however, requires soldering work by hand, and therefore, its manufacturing cost cannot be reduced substantially, as compared with the second type of shielding structure. In view of the trend of rising labor expenses, it is believed that the third type of shielding structure cannot have an economically advantageous position in competing with the second type of shielding structure in the future.

SUMMARY OF THE INVENTION

It is an object of the present invention to provide an electromagnetic wave shielding panel and wall structure which are appropriate for forming shielding walls or rooms of improved shielding characteristics at a reduced manufacturing cost.

According to a first aspect of the present invention, an electromagnetic wave shielding panel comprises a plate member of electrically nonconductive material having an electrically conductive foil applied to at least one surface thereof and an electrically conductive net laid on the electrically conductive foil with its fringe portion extending beyond the edge of said plate member. Cooper or aluminum foils are practically used as the electrically conductive foil.

According to a second aspect of the present invention, an electromagnetic wave shielding wall comprises at least two electromagnetic wave shielding panels, each formed according to the first aspect, that are arranged side by side. The adjacent side surfaces of the panels are abutted against each other with their fringe portions sandwiched therebetween.

The present invention further features an electromagnetic wave shielding panel which comprises: a plate core member of an electrically nonconducting substance; frame members of an electrically nonconducting substance, attached to the side surfaces of said plate core member, each having a longitudinal slot made on at least one side surface; an electrically conductive foil applied to at least one surface of a panel member which is composed of said plate core member and frame member; and an electrically conductive net laid on said electrically conductive foil with its fringe portion extending beyond the edge of said panel member. The plate core and frame members may be made in a unitary form.

The present invention further features an electromagnetic wave shielding panel which comprises: a plate core member of an electrically nonconducting substance; frame members of an electrically nonconducting substance, attached to the side surfaces of said plate core member, each having a longitudinal ridge on at least one side surface; an electrically conductive foil applied to at least one surface of a panel member which is composed of said plate core member and frame member; and an electrically conductive net laid on said electrically conductive foil with its fringe portion extending beyond the edge of said panel member.

Further according to the present invention, an electromagnetic wave shielding wall structure comprises at least two electromagnetic wave shielding panels according to the third aspect, arranged side by side. The adjacent side surfaces of said panels are abutted against each other and connected to each other with a wedge member fitted in the longitudinal slots of the adjacent side faces of said panels and the net fringe portions of said panels are laid in said slots and pinched by said wedge.

According to a still further aspect of the present invention, an electromagnetic wave shielding wall structure comprises at least one electromagnetic wave shielding panel according to the third aspect, and at least one electromagnetic wave shielding panel according to the fourth aspect. These panels are integrally connected with the ridge of the panel inserted in the slot of the counter panel. The net fringe portions of said panels are laid in said slot and are pinched by said ridge.

According to a still further aspect of the present invention, an electromagnetic wave shielding wall structure comprises at least two electromagnetic wave shielding panels according to the third aspect; a post having a longitudinal slot made on each of at least two side surfaces of the post; and at least two wedge members fitted in the slots of said post and panels to integrally connect said panels. The net fringe portions of the panels are laid in said slots and are pinched by said ridges.

All or selected combinations of panels according to the third aspect and associated wedge member may be replaced by panels according to the fourth aspect.

Also, all or selected combinations of post and associated wedge members may be replaced by a post having a longitudinal ridge on at least one side surface thereof.

According to still another aspect of the present invention, an electromagnetic wave shielding wall structure comprises at least two electromagnetic wave shielding panels each having an underlying electrically conductive foil and an overlying electrically conductive net on each opposite surface of a plate core member according to the third aspect; and at least one wedge member fitted in the slots of the opposite side surfaces of said electromagnetic wave shielding panels. The net flange portions of the electromagnetic wave shielding panels are laid in the slots so that the net fringe portions extending beyond the edges of one surfaces of the electromagnetic wave shielding panels are separated and electrically isolated from those extending beyond the edges of the other surfaces of said electromagnetic wave shielding panels. The net fringe portions are pinched by said wedge member.

According to still another aspect of the present invention, an electromagnetic wave shielding wall structure comprises: at least two electromagnetic wave shielding panels each having an underlying electrically conductive foil and an overlying electrically conductive net on each opposite surface of a plate core member according to the third aspect; a post of an electrically nonconductive substance, having a longitudinal slot on each of at least two side surfaces of the post; and at least two wedge members fitted in the aligned slots of said panels and post to integrally connect said panels and post. The net fringe portions of said electromagnetic wave shielding panels are laid in said slots in such a condition that the net fringe portions extending beyond the edge of one surfaces of said electromagnetic wave shielding panels are separated and electrically isolated from those extending beyond the edges of the other surfaces of said electromagnetic wave panels; the net fringe portions being pinched by said wedge member.

In every electromagnetic wave shielding wall structure according to the present invention, the joint between adjacent panels is preferably covered by a piece of electrically conductive foil.

As described above, an electromagnetic wave shielding panel and wall structure according to the present invention uses both an electrically conductive foil and net on its plate member, thereby permitting necessary electrical connection to be made by using its net fringe portion, thus eliminating the necessity of soldering adjacent edges of the copper foils of adjacent panels as is the case with a conventional electromagnetic wave shielding panel, according reducing the manufacturing cost. Pieces of electrically conductive foil can be applied to the joints between adjacent panels by using adhesive, and therefore little or no extra working cost is incurred.

No iron sheets are used because iron is not appropriate for the shielding purpose. Panels are also, therefore, relatively light. The use of electrically conductive foil of a relatively low permeability makes the electromagnetic wave shielding panel appropriate for use in a strong magnetic field.

The use of electrically conductive foil causes appearance of eddy currents from a varying magnetic field arriving at the electromagnetic wave shielding panel, thereby reducing the effect of the magnetic field on one side of the shielding panel, whereas the use of electrically conductive net causes the shielding effect on the electric field of the arriving electromagnetic wave. The shielding effect can be retained by reducing the mesh size of the net with the increase of frequency.

Electric field shielding effect at the joint between adjacent panels can be assured by overlaying the net fringe portions of adjacent panels to put them in electrical contact. The flexibility and resilience of the metal net facilitates making of required electrical connection. Pieces of electrically conductive foil applied to the joints between adjacent panels increase the magnetic field shielding effect.

Other object and advantages of the present invention will be understood from the following description of electromagnetic wave shielding panels according to preferred embodiments of the present invention, which are shown in accompanying drawings.

DESCRIPTION OF THE PREFERRED EMBODIMENT

Figures 1A, 1B:
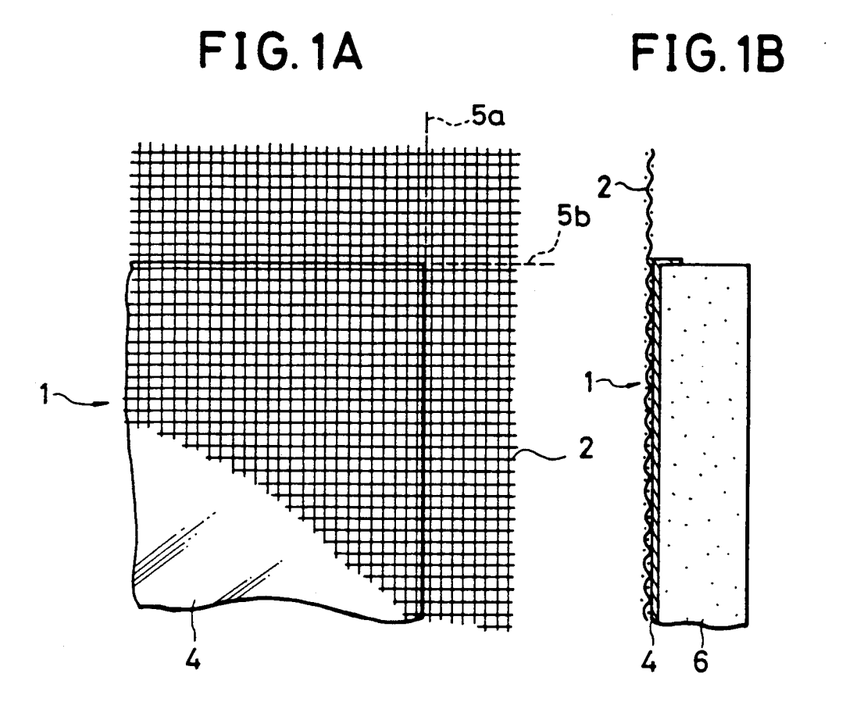
FIGS. 1A and 1B are fragmentary front and side views of one form of an electromagnetic wave shielding panel according to the present invention, respectively.

FIGS. 1A and 1B respectively show front and side views of a part of an electromagnetic wave shielding panel according to the first embodiment of the present invention.

As shown, an electromagnetic wave shielding panel 1 comprises a plate member 6 of an electrically nonconducting substance, an electrically conductive foil 4 such as copper or aluminum foil applied to at least one surface of the plate member 6, and an electrically conductive net 2 laid on the electrically conductive foil 4 with its fringe portion extending beyond the edge of the plate member 6. The metal net 2 may be applied to the other surface of the plate member 6. The metal net 2 is large enough to allow its fringe portion to extend beyond the edge of the plate member 6. The mesh and wire sizes of the net are selected to be appropriate for particular purposes. In a particular example, the wire size is about 0.15 mm, and inter-wire space or mesh size is about 1.5 mm. If occasions demand, the fringe of the metal net 2 may be extended beyond one selected edge of the plate member 6. The corner of the extending fringe may be cut and removed as indicated by lines 5a and 5b in order to facilitate panel connection. Foil 4 is attached to plate member 6 by adhesive, and metal net is attached to foil 4 by adhesive, too. Other fixing means if economically advantageous, may be used.

Figure 2:
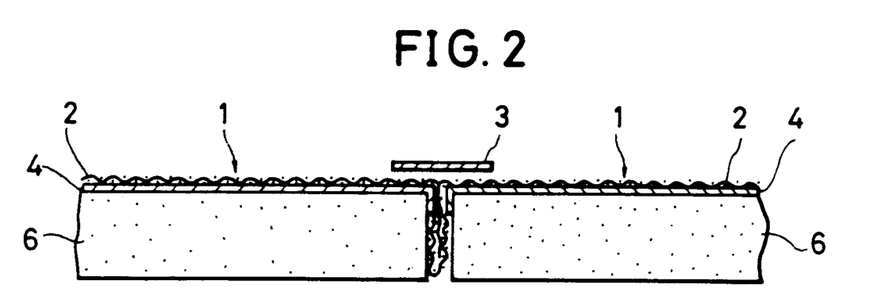
FIG. 2 represents, in section, the electromagnetic wave shielding panels which are arranged side by side and connected together.

FIG. 2 represents, in section, the electromagnetic wave shielding panels arranged side by side and connected together. As shown, two electromagnetic wave shielding panels 1 are arranged side by side, the adjacent side surfaces of the panels being abutted against each other with their fringe portions bent and sandwiched therebetween. Thus, the metal nets 2 of the panels 1 are electrically connected, thereby retaining the electric field shielding function at a joint therebetween. Also, a copper foil strip 3 twice as large as the joint area is applied to the joint to prevent leakage of magnetic field from the joint to the other side.

Figure 3:
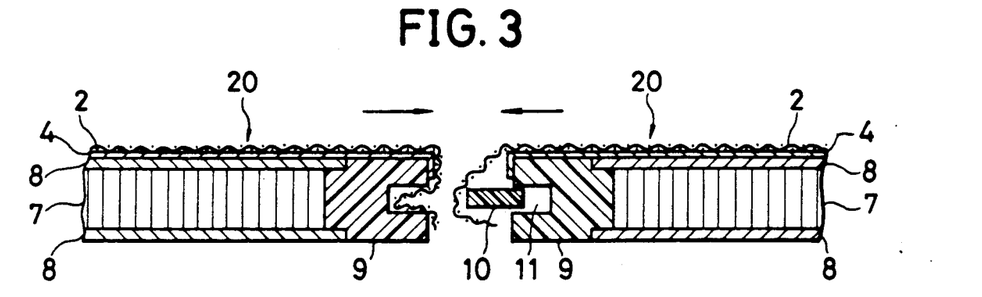
FIG. 3 to 6 show, in section, how different panels are arranged side by side and how the adjacent side surfaces are connected.

FIG. 3 represents, in section, two panels 20 each having an improved plate member, showing how these panels 20 are connected.

Figure 8:
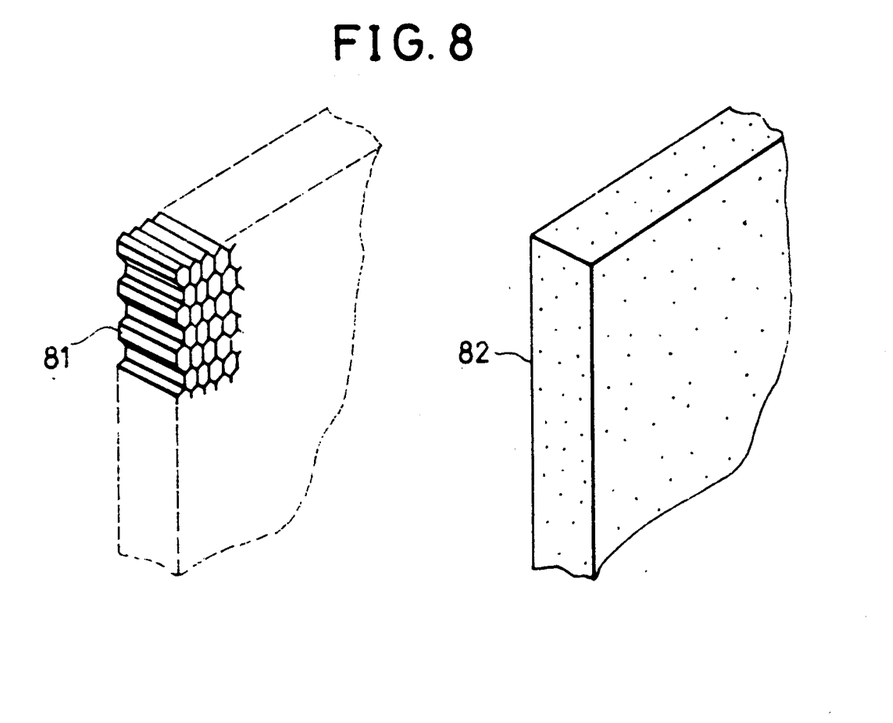
FIG. 8 is perspective views of different plate core members.

As shown, the plate member of each panel 20 is composed of a plate core 7, sheet members 8 applied to the opposite surfaces of the plate core 7, and frame members 9 fixed to opposite side surfaces of the plate core 7. As shown in FIG. 8, the plate core 7 may be a paper honeycomb 81, a gypsum board 82 or the like. The sheet member 8 may be a synthetic resin sheet or any other material whose surface permits adhesion of copper foil. Finally, the frame 9 may be of an appropriate material for constituting the edge structure of the panel 20, for instance synthetic resin. The frame 9 which is to be put in contact with the side surface of the adjacent panel, has a longitudinal slot 11.

In connecting these panels 20, they are arranged side by side with their slotted frames 9 facing each other as seen from FIG. 3. Then, the fringe portions of the nets 2 of the adjacent panels 20 are laid in the slot 11 of one of these panels 20, and thereafter a plug or wedge member 10 of an electrically nonconducting substance is inserted in the longitudinal space 9, which are defined by the slots of the adjacent panels 20. The size and shape of the wedge member 10 are determined so as to cause generation of sufficient holding force upon insertion of the wedge member in the opposite slots of the adjacent panels 20. The wedge member may be made of fiber reinforced plastics to increase the strength of the electromagnetic shielding wall structure.

Figure 4:
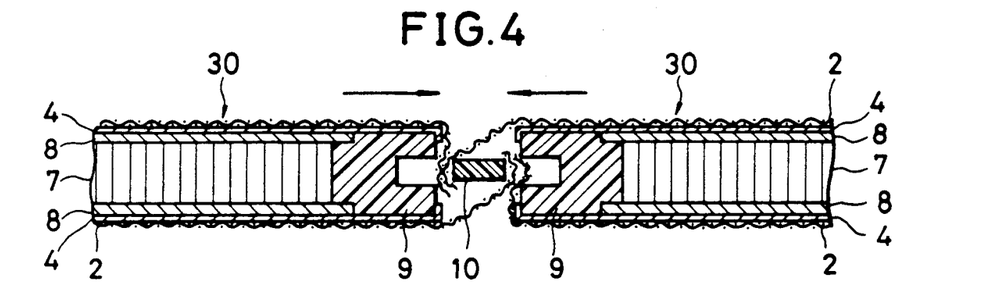

FIG. 4 represents, in section, two panels 30 arranged side by side with their slotted frames facing each other. The panel 30 is different from the panel 20 of FIG. 3 only in that the panel 30 has copper foils 4 and metal nets 2 applied to the opposite surfaces of the plate core 7, thereby providing a double shielding structure.

As seen from FIG. 4, the net fringe portions extending beyond the edge of one surfaces of the electromagnetic wave shielding panels 30 are separated and electrically isolated by the wedge 10 from those extending beyond the edge of the other surface of the electromagnetic wave shielding panels 30. Stated briefly, the fringe portions of the nets laid on the same sides are connected together, and the fringe portions of the nets laid on the opposite sides are electrically isolated from each other. For this purpose, the slot of one panel is used to accept the fringe portions of the nets each laid on one side each of the adjacent panels whereas the slot of the other panel is used to accept the fringe portions of nets each laid on the other side each of the adjacent panels.

Figure 5:
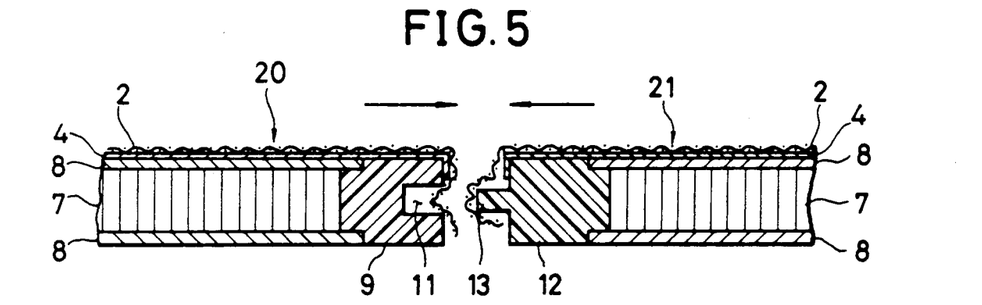

FIG. 5 represents, in section, a panel 20 having a slotted frame 9 and a panel having a ridged frame 12, arranged side by side with their slotted and ridged frames facing each other. As shown, the frame 12 of the panel 21 has a longitudinal ridge 13, and the frame 9 of the panel 20 has a longitudinal slot 11. These male and female structures take the place of the wedging member 10, which otherwise, would be used in integrally connecting the adjacent panels. A panel may have a slotted frame member 9 on one side thereof and a ridged frame member 12 on the other side thereof.

Figure 6:
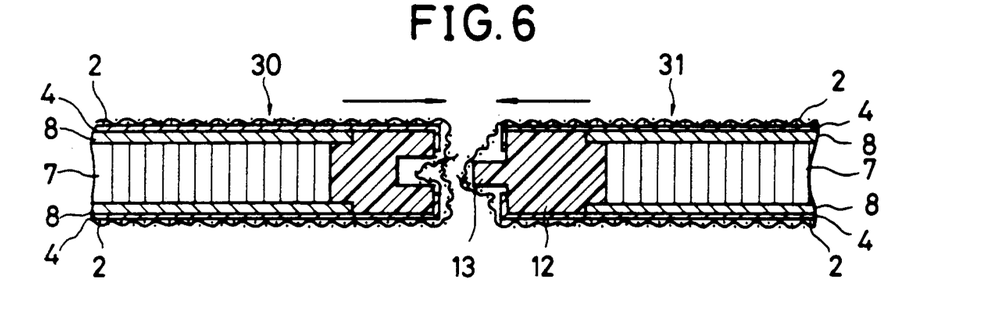

FIG. 6 represents, in section, a panel 20 having a slotted frame 9 and a panel having a ridged frame 12, arranged side by side with their slotted and ridged frames facing each other. This electromagnetic wave shielding structure is different from that of FIG. 5 only in that each panel has copper foils 4 and nets 2 on both sides. It is, however, not of double shielding structure as shown in FIG. 4.

Figure 7A:
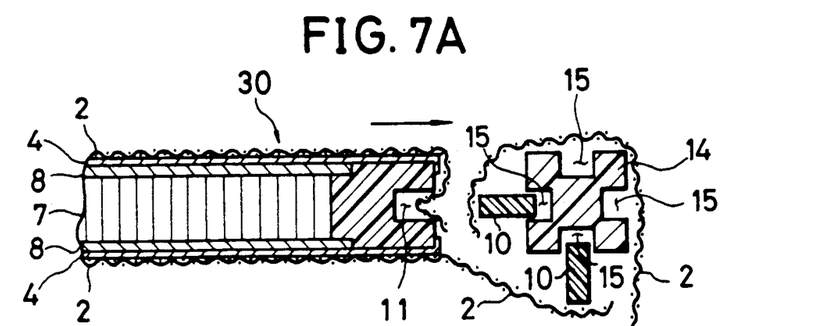
FIG. 7A and 7B are sectional views showing how adjacent panels are connected by an associated post.
Figure 7B:
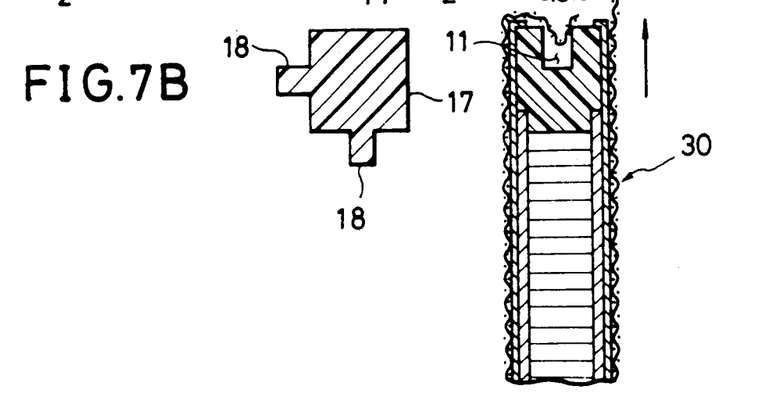

FIG. 7A represents an electromagnetic shielding structure using a post 14 to connect the panels 30. The post 14 is made of an electrically nonconducting substance such as synthetic resin material, thereby preventing it from functioning as an antenna. As seen from the drawing, the post 14 has a longitudinal slot 15 made on each side, thereby permitting connection of slotted panels 30 in all directions. The post may have longitudinal slots on two or three selected sides thereof so as to meet particular purpose. In this example the nets 2 laid on the same sides are electrically connected by their fringe portions, to provide a dual shielding structure. As shown, the post 14 is used to connect two panels perpendicular to each other. It can be used to connect two panels side by side as shown in FIG. 3. When the panels are used as ceiling members, the posts may be used as beams or joints. A post 17 (FIG. 7B) having ridges 18 on selected or all sides, may be used in place of the slotted post 14. These ridges serve the same function as wedges 10. Otherwise, ridged panels 21 or 31 as shown in FIG. 5 and 6 may be used in place of the panels 30 in FIG. 7A. In all electromagnetic wave shielding walls shown in FIGS. 3 to 7A, copper foil strips may be applied to the joints between adjacent panels to improve the magnetic field shielding effect.

Some examples of electromagnetic wave shielding walls according to the present invention were tested according to MIL. STD-285, and the test results are given in comparison with a standard shielding structure as shown in FIGS. 12 to 16.

Figure 9:
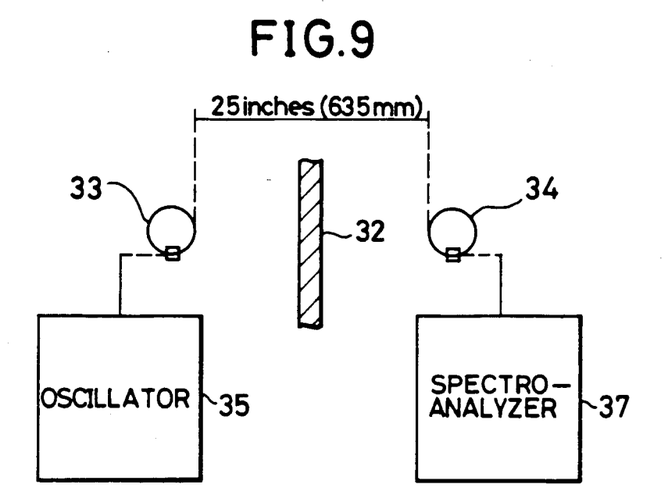
FIGS. 9 to 11 show the manner in which the shielding effect is determined.
Figure 10A:
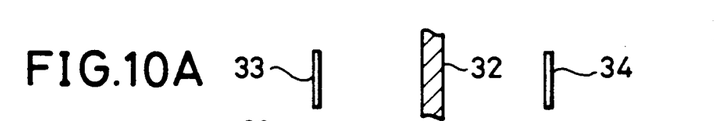
Figure 10B:
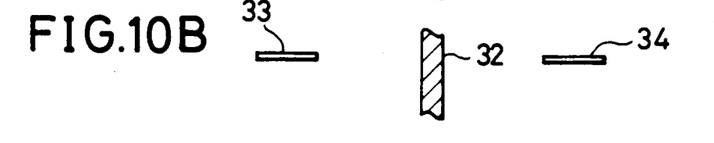

As illustrated in FIG. 9, an oscillator 35 was combined with a loop antenna 33, and a spectro-analyzer 37 was combined with a loop antenna 34. These antennas were separated 25 inches (635 mm) from each other, and an object 32 to be tested was put between these antennas. As shown in FIG. 10A these antennas were arranged in parallel relationship, and as shown in FIG. 10B these antennas were arranged in aligning relationship.

Figure 11:
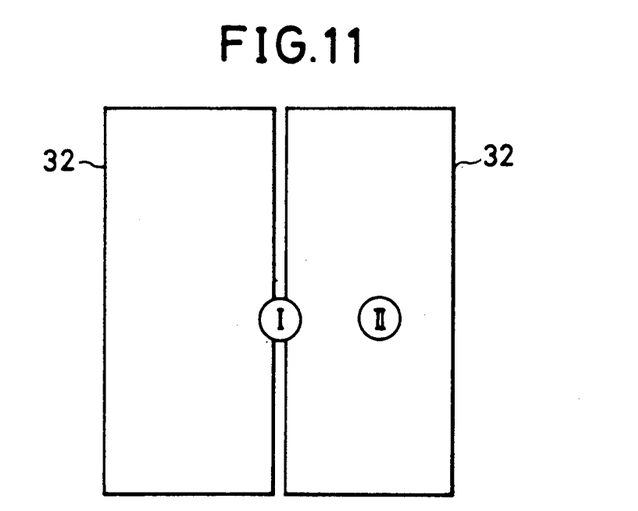

As for objects 32 to be tested, a first shielding wall comprised a metal net only which was used as a basis of comparison; a second shielding wall comprised metal net and copper foil according to the present invention; and a third shielding wall was similar to the second shielding wall which additionally had copper foil strips attached to the joint between adjacent panels. As seen from FIG. 11, the adjacent panels were arranged side by side, and were connected without using a post therebetween. Measurements were taken at the joint as indicated at I, and at the center as indicated at II.

Figure 12A:
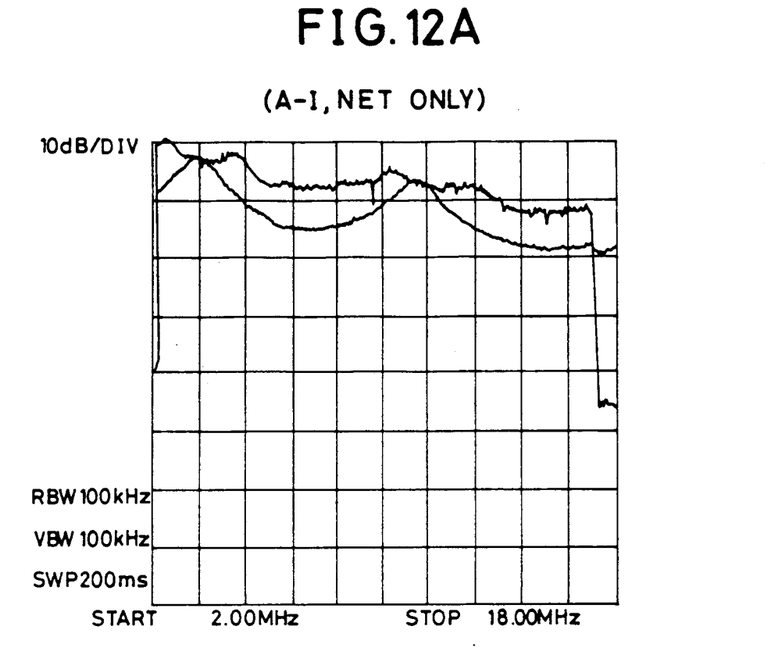
FIGS. 12 to 16 show graphs representing the shielding effect caused by electromagnetic wave shielding panels according to the present invention and conventional electromagnetic wave shielding panels.
Figure 12B:
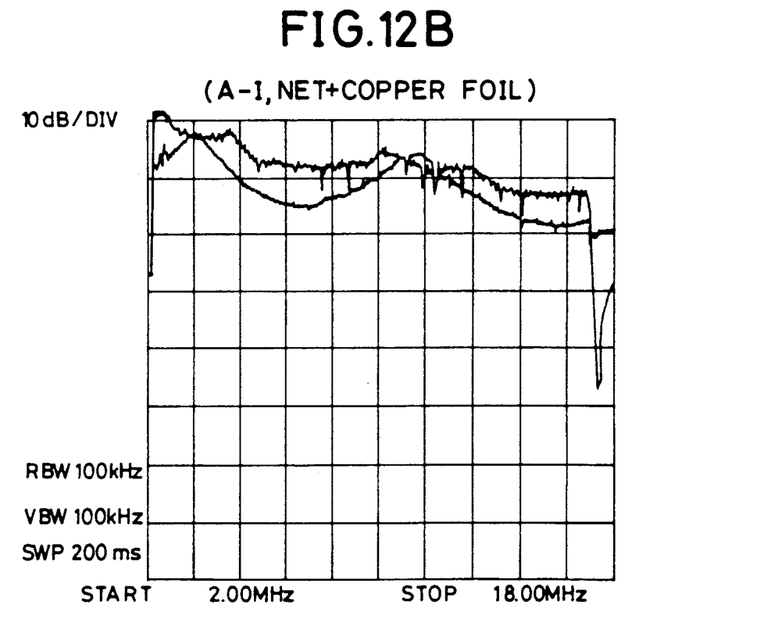
Figure 12C:
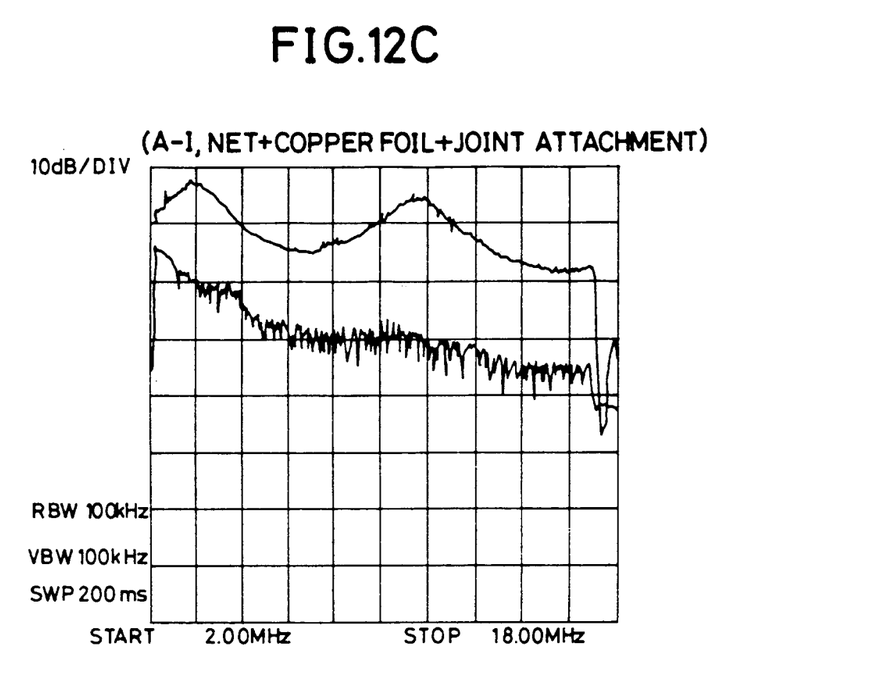

The graphs of FIG. 12 show the test results of the first, second and third shielding walls. These tests were conducted with the antennas directed as indicated in FIG. 10A, and measurements were taken at the joint position I. The frequency ranged from 2 MHz to 18 MHz. The output power of the oscillator 35 was adjusted to be 1 mV in absence of an object to be tested, and 1 V in presence of the object to be tested. Therefore, the measurements of attenuation of electromagnetic wave energy must be corrected by adding 60 dB to the difference (dB value) between the curves appearing in each graph. Specifically, the attenuation amount of electromagnetic wave energy of the first shielding wall is 60 to 70 dB as seen from FIG. 12A, and almost same attenuation amount results from the second shielding wall as seen from FIG. 12B. There is little or no difference between the first and second shielding walls in attenuation effect at their joints. In contrast, the attenuation amount of the third shielding wall is 70 or more dB as seen from FIG. 12C, showing an improved effect at the joint between adjacent panels. Also, a test was performed to check the joint shielding effect which was caused simply by electrical connection of the copper foils of the adjacent panels. This electrical connection was simulated by laying on the joint a copper foil as large as the panel. The test showed the same result as that of the third shielding wall (FIG. 12C).

Figure 13A:
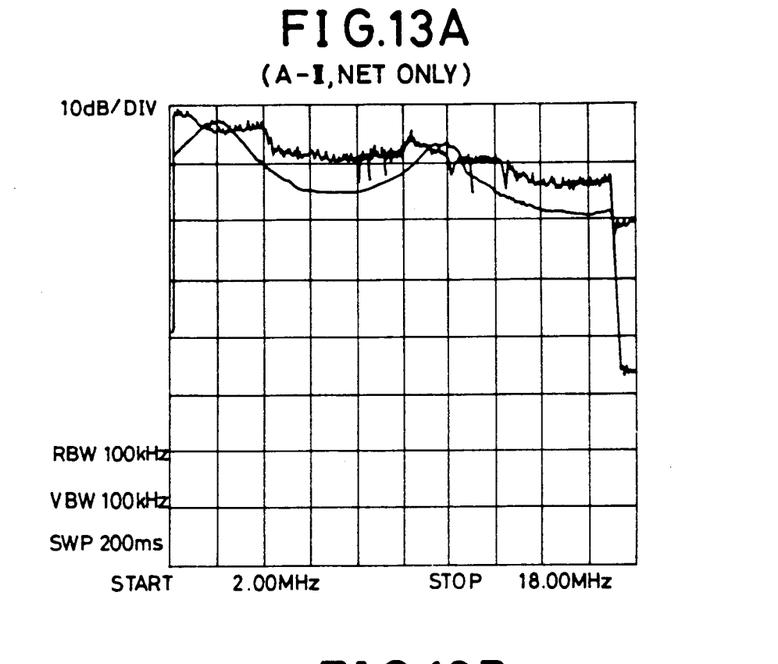
Figure 13B:
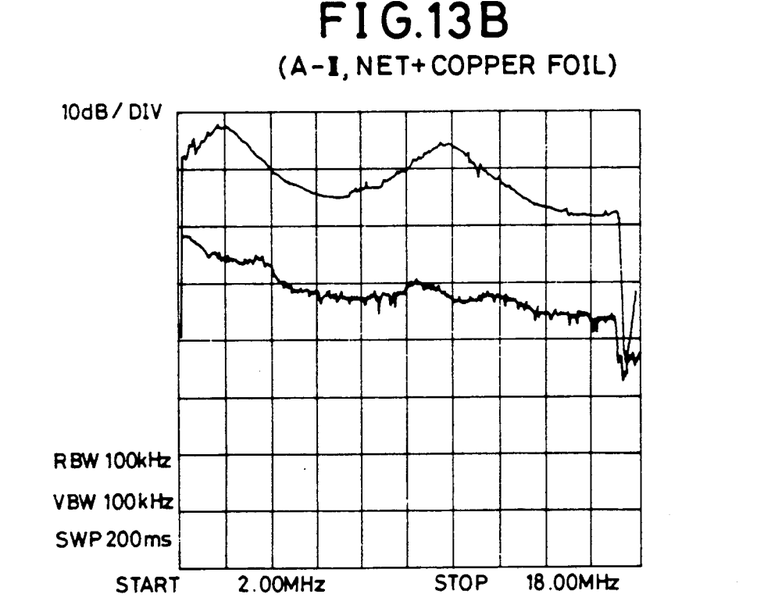
Figure 13C:
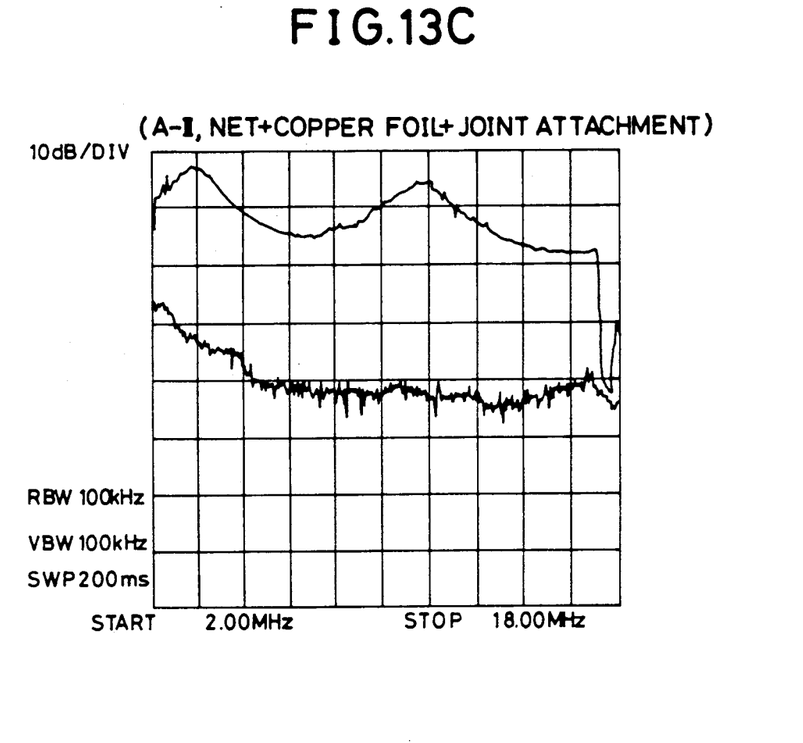

The graphs of FIGS. 13A to 13C show the test results of the first, second and third shielding walls at the center portion II.

FIG. 13A shows substantially the same results as FIG. 12A, showing little or no difference between the joint and center positions in case the panel comprised net only.

FIG. 13B shows substantial improvement of the shielding effect by the second shielding structure (net plus copper foil) over the first shielding structure (net only; FIG. 12A). The shielding effect was caused by the copper foil at the center position II even when the joint between adjacent panels remained discontinuous. FIG. 13C shows a substantially increased amount of shielding effect over FIG. 13B by the second shielding structure having its joint treated for prevention of leakage of electromagnetic wave energy, although not remarkable as is the case with the measurement at the joint position I (cp. FIGS. 12B and 12C).

Figure 14A:
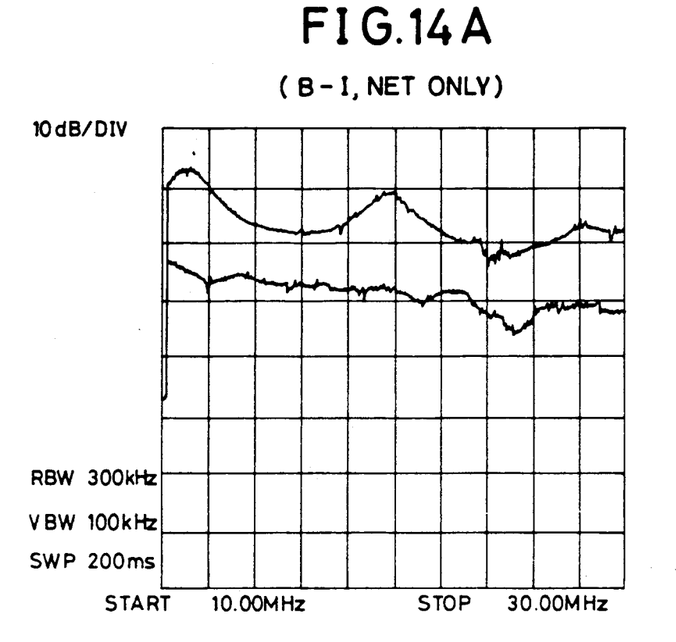
Figure 14B:
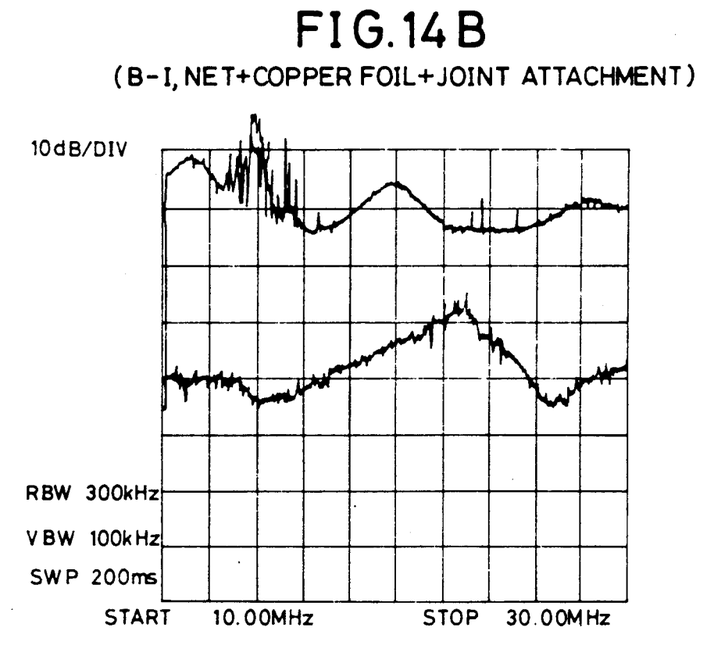

The graphs of FIGS. 14A and 14B show the test results of the first, second and third shielding structures at the joint portion I with the antennas arranged as shown in FIG. 10B. The frequency ranged from 10 MHz to 30 MHz, and the difference between the output power of the oscillator in absence of the object to be tested and that in presence of the object to be tested was 80 dB.

Figure 15A:
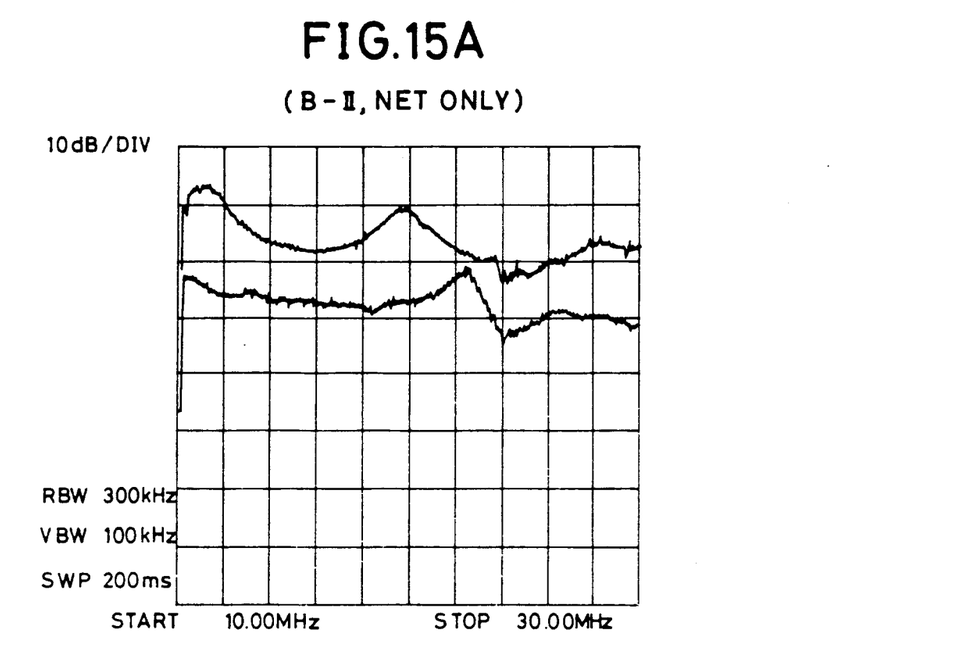
Figure 15B:
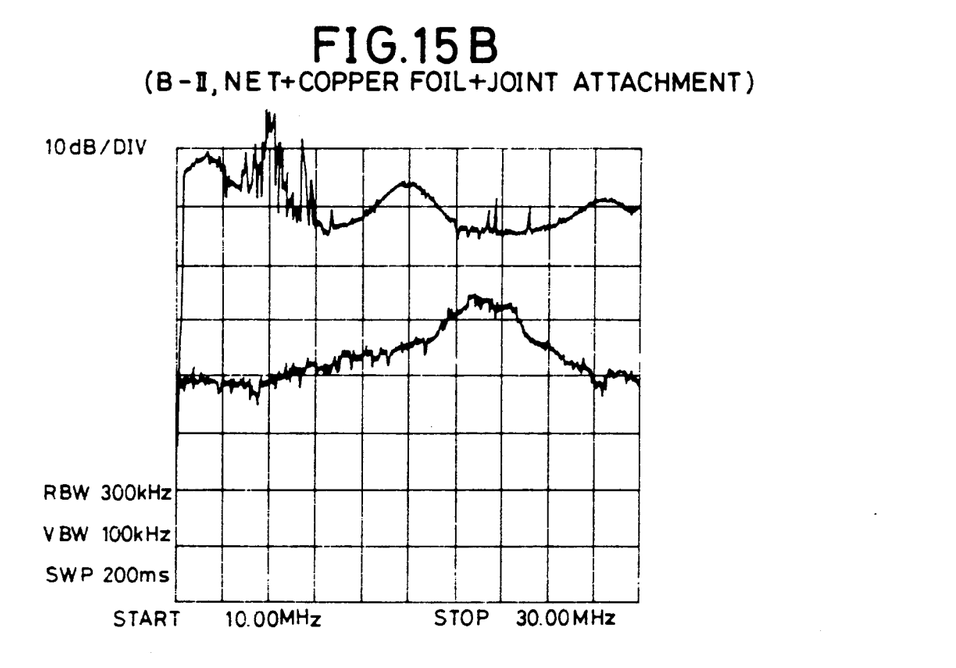

FIG. 14B shows remarkable improvement of shielding effect attained by the third shielding wall having its joint treated for prevention of electromagnetic wave energy, compared with the first shielding wall (FIG. 14A). FIGS. 15A and 15B show the test results for the same measuring conditions as in FIGS. 14A to 14C although the measuring portion was changed from the joint position I to the center position II. FIG. 15A and 15B show almost the same results as FIGS. 14A to 14C.

The improvement in the joint shielding effect is realized from the fact that FIG. 14B show the same shielding result as FIG. 15B.

Figure 16:
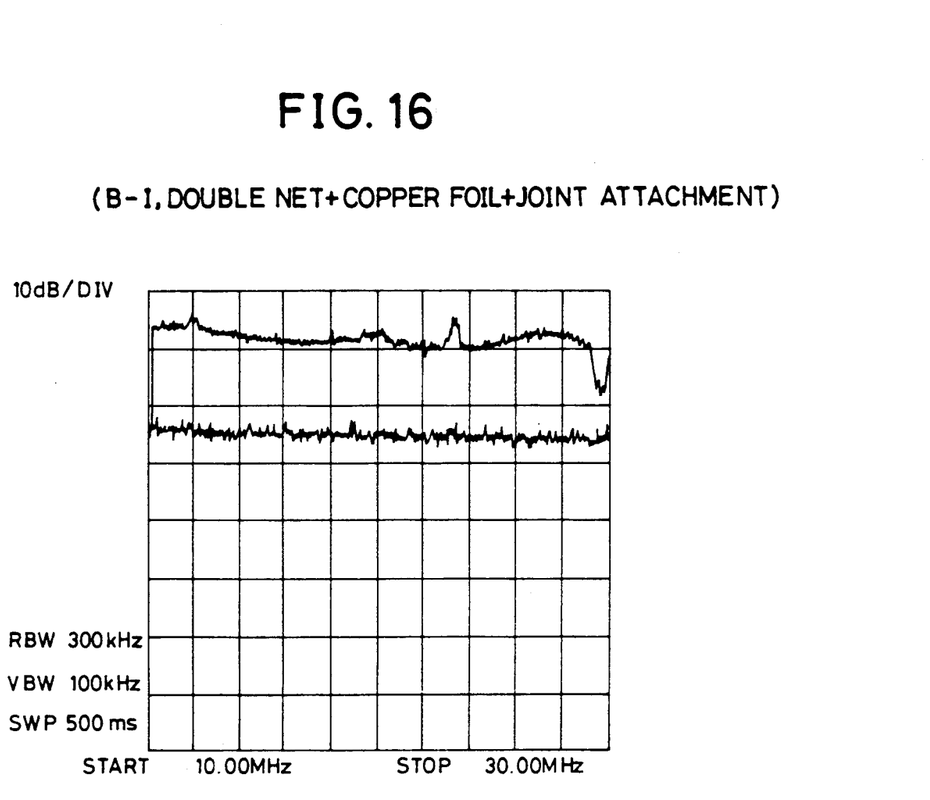

The sole graph of FIG. 16 shows the test result of a double shielding structure as shown in FIG. 4 with its joint treated for prevention of leakage of electromagnetic wave. Measurements were taken at the joint position I, and the antennas were directed as indicated in FIG. 10B. The difference between the output power of the oscillator in absence of the object to be tested and that in presence of the object was 90 dB. FIG. 16 shows an increase of 15 dB or more over the single shielding structure (FIG. 14B) around 27 MHz at which the worst shielding effect resulted. As seen from the graph, the shielding effect of 100 or more dB is caused over a relatively wide frequency range.

For aesthetic purposes, wall paper or the like may be applied to the panels to conceal the exposed net on the panel.

As is apparent from the above, the use of electrically conducting foil and net, which is large enough to allow its fringe portion to extend beyond the under underlying plate core, improves the shielding effect of electromagnetic wave, and the manufacturing cost of the shielding room lowers substantially.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

what is claimed is:

1. An electromagnetic wave shielding panel, comprising:
   a plate member of electrically nonconductive material;
   an electrically conductive foil applied to at least one surface of the plate member; and
   an electrically conductive net laid on the electrically conductive foil to extend beyond the edges of the plate member.

2. An electromagnetic wave shielding panel according to claim 1, wherein:
   said foil is applied to said plate member by an adhesive.

3. An electromagnetic wave shielding panel according to claim 1, wherein:
   said net is attached to said plate member by an adhesive.

4. An electromagnetic wave shielding panel according to claim 1, further comprising:
   means for covering said net, applied to cover said net for esthetic purposes.

5. An electromagnetic wave shielding wall structure, comprising:
   at least two electromagnetic wave shielding panels each comprising a plate member of electrically nonconductive material,
   an electrically conductive foil applied to at least one surface of each plate member, and
   an electrically conductive net laid on the electrically conductive foil to extend beyond the edges of each plate member,
   said panels being arranged side by side, so that the adjacent side surfaces thereof are abutted against each other with their respective extended net portions sandwiched therebetween where said panels abut.

6. An electromagnetic wave shielding wall structure as claimed in claim 5, wherein:
a joint between adjacent panels is covered by a piece of electrically conductive foil.

7. An electromagnetic wave shielding panel, comprising:
a plate core member of an electrically nonconducting substance;
frame members of an electrically nonconducting substance, attached to side surfaces of said plate core member, each frame member having a longitudinal slot formed on at least one side surface;
an electrically conductive foil applied to at least one surface of a panel member which is composed of said plate core member and said frame members; and
an electrically conductive net disposed on said electrically conductive foil to extend beyond the edges of said panel member.

8. An electromagnetic wave shielding wall structure, comprising at least two electromagnetic wave shielding panels as defined in claim 7, wherein:
said panels are arranged side by side so that adjacent side surfaces of said panels are abutted against and are connected to each other with a plug member fitted in the longitudinal slots of the adjacent side surfaces, the extended portions of the nets being placed in said slots and pinched by said plug.

9. An electromagnetic wave shielding panel, comprising:
a plate core member of an electrically nonconducting substance;
frame members of an electrically nonconducting substance, attached to the side surfaces of said plate core member, said frame members each having a longitudinal ridge on at least one side surface;
an electrically conductive foil applied to at least one surface of a panel member which is composed of said plate core member and frame member; and
an electrically conductive net disposed on said electrically conductive foil with its fringe portion extending beyond the edge of said panel member.

10. An electromagnetic wave shielding wall structure, comprising a first electromagnetic wave shielding panel as defined in claim 9, further comprising:
a second electromagnetic wave shielding panel having a plate core member of an electrically nonconducting substance, frame members of an electrically nonconducting substance, attached to the side surfaces of said plate core member, said frame members each having a longitudinal ridge on at least one side surface, an electrically conductive foil applied to at least one surface of a panel member which is composed of said plate core member and frame member, and an electrically conductive net disposed on said electrically conductive foil with its fringe portion extending beyond the edge of said panel member,
the extended portions of the respective nets being laid in said slot and pinched by said ridge with said first and second panels being integrally connected by insertion of said ridge of said first panel into said slot of said second panel.

11. An electromagnetic wave shielding wall structure, comprising:
at least two electromagnetic wave shielding panels, each comprising a plate core member of an electrically nonconducting substance, frame members of an electrically nonconducting substance, attached to side surfaces of said plate core member, each frame member having a longitudinal slot made on at least one side surface, an electrically conductive foil applied to at least one surface of a panel member which is composed of said plate core member and said frame members, and an electrically conductive net disposed on said electrically conductive foil to extend beyond the edges of said panel member;
a post having a longitudinal slot made on each of at least two side surfaces of the post; and
at least two wedge members fitted in the slots of said post and said panels to integrally connect said panels, the extended portions of the nets being disposed in said slots and pinched by said wedges therein.

12. An electromagnetic wave shielding wall structure as claimed in claim 11, wherein:
a selected combination of a post and associated wedge member is replaced by a ridged post having a longitudinal ridge on at least one side thereof.

13. An electromagnetic wave shielding wall structure, comprising:
at least two electromagnetic wave shielding panels each having an underlying electrically conductive foil and an overlying electrically conductive net on each of two opposite surfaces of a plate core member formed of an electrically nonconducting substance, frame members of an electrically nonconducting substance attached to side surfaces of said core member, each frame member having a longitudinal slot formed on at least one side surface, and an electrically conductive net disposed on said electrically conductive foil to extend beyond the edges of said panel member; and
at least one wedge member fitted in the slots of the opposite side surfaces of said electromagnetic wave shielding panels;
the net fringe portions of said electromagnetic wave shielding panels being laid in said slots so that the net fringe portions extending beyond the edge of one surface of said electromagnetic wave shielding panels separated and electrically isolated from those extending beyond the edge of the other surfaces of said electromagnetic wave shielding panels, the net fringe portions being pinched by said wedge member.

14. An electromagnetic wave shielding wall structure, comprising:
at least two electromagnetic wave shielding panels each having an underlying electrically conductive foil and an overlying electrically conductive net on each of two opposite surfaces of a plate core member formed of an electrically nonconducting substance, frame members of an electrically nonconducting substance attached to side surfaces of said core member, each frame member having a longitudinal slot formed on at least one side surface, and an electrically conductive net disposed on said electrically conductive foil to extend beyond the edges of said panel member;
a post of an electrically nonconductive substance, having a longitudinal slot on each of at least two sides of the post; and at least two wedge members fitted in said respective slots of said panels and post, with said slots aligned, to integrally connect said panels and said post, the net fringe portions of said electromagnetic wave panels being laid in said slots in so that the net fringe portions extending beyond the edges of one of the surfaces of said electromagnetic wave shielding panels on one side thereof are separated and electrically isolated from the net fringe portions extending beyond the edges of the other surface of said electromagnetic wave shielding panels on the opposite side thereof, the corresponding net fringe portions being respectively pinched by said wedge member.

* * * * *